United States Patent [19]

Dubhashi et al.

[11] Patent Number: 5,801,557
[45] Date of Patent: Sep. 1, 1998

[54] HIGH VOLTAGE DRIVERS WHICH AVOID $-V_S$ FAILURE MODES

[75] Inventors: Ajit Dubhashi, El Segundo; Leon Aftandilian, Thousand Oaks, both of Calif.

[73] Assignee: International Rectifier Corp.

[21] Appl. No.: 728,309

[22] Filed: Oct. 9, 1996

Related U.S. Application Data

[60] Provisional application No. 60/004,981 Oct. 10, 1995.
[51] Int. Cl.⁶ ................................................. H03B 1/00
[52] U.S. Cl. ........................... 327/108; 327/110; 327/382; 327/565
[58] Field of Search .................................... 327/108, 110, 327/374, 382, 565–6, 482

[56] References Cited

U.S. PATENT DOCUMENTS

| | | | |
|---|---|---|---|
| 5,412,332 | 5/1995 | Heeringa et al. | 327/110 |
| 5,686,859 | 11/1997 | Majumdar et al. | 327/110 |

*Primary Examiner*—Margaret Rose Wambach
*Attorney, Agent, or Firm*—Ostrolenk, Faber, Gerb & Soffen, LLP

[57] ABSTRACT

In a level shifted high voltage MOSgate device driver which drives MOSgate devices such as IGBTs and power MOSFETs, effects of negative voltage swings caused by currents commutating through $L_{S1}$ and $L_{S2}$ inductances in the power circuits are avoided due to several measures. First, the values of the inductances $L_{S1}$ and $L_{S2}$ are reduced by keeping short conductor lengths, by other layout/wire bonding techniques to reduce the values of the $L_{S1}$ and $L_{S2}$ inductances. The external, charging capacitor $C_b$ value is increased substantially to reduce the voltage buildup on the internal circuitry. A typical value is 0.47 μF, for a given circuit, IGBT and layout combination. The size of the $C_{VCC}$ capacitor is selected to keep the supply voltage as stiff as possible. Preferably, $C_{VCC}$ is at about ten times the value of the sum of the $C_b$ capacitance in the circuit. The resistance $R_b$ in the bootstrap path is reduced as much as possible, preferably to zero. Finally, a resistor $R_{COM}$ is optionally added between the common nodes of the driver circuit and the power device circuit.

7 Claims, 2 Drawing Sheets

HIGH VOLTAGE DRIVERS WHICH AVOID -$V_S$ FAILURE MODES

RELATED APPLICATIONS

This application claims the benefit of U.S. Provisional application Ser. No. 60/004,981 filed on Oct. 10, 1995.

BACKGROUND OF THE INVENTION

The present invention relates to level shifted high voltage MOSgate device drivers and, more particularly, to MOS-gated device drivers with improved immunity to deleterious effects of commutating currents.

Level shifted high voltage MOSgated device drivers are well known for the drive of bridge connected MOSgated devices, such as IGBTs and power MOSFETs. A family of such devices are sold under the type numbers IR21XX, which are high voltage integrated circuit (HVIC) devices, which each drive two such MOSgated devices per leg of a bridge. FIGS. 1 and 2 show typical configurations for an IR21XX driver (for example, an IR2155) for high side and low side IGBTs 10 and 11 respectively, which are associated with fast recovery diodes 12 and 13, respectively. The $H_O$ and $L_O$ outputs at pins 4 and 2, respectively, turn devices 10 and 11 sequentially on and off to control power flow to the output circuit (not shown).

In operation, when the top device 10 is turned off, the current $I_{10}$ commutates to the bottom diode 13, as $I_{13}$, as shown in FIG. 3. The current $I_{13}$ flows through the inherent inductances $L_{S1}$ and $L_{S2}$ in series with diode 13, causing the voltage at $V_O$ to go to $-V_e$. This negative voltage can cause the driver IC 20 to malfunction or blow-up. This problem is even more intense under short circuit conditions.

SUMMARY OF THE INVENTION

Accordingly, it is an object of the present invention to provide level shifted high voltage MoSgated device drivers that are built to withstand the deleterious effects of commutating currents.

The foregoing and other objects of the invention are realized by constructing the device such that the internal inherent inductances $L_{S1}$ and $L_{S2}$ have lower values, which is attained by keeping shorter conductor lengths and positioning the $D_b$ and common (COM) connection in a manner which reduces the inductance path. Furthermore, the device's $C_b$ capacitance is increased in order to reduce the voltage developing on this capacitor. Further expedients involve increasing the size of the $C_{VCC}$ capacitor to hold the $C_{VCC}$ voltage as stiff as possible, to ensure that the internal IC diode $D_S$ cannot turn on earlier. Very approximately, the capacitance $C_{VCC}$ should have a value ten times the total of all $C_b$ capacitors in the system.

The invention further attains its objectives by reducing the resistance $R_b$ and the bootstrap path as much as possible, to cause reduced current flow through the substrate diode. Finally, the invention contemplates providing a resistor $R_{COM}$ to increase the resistance in the path of the substrate diode $D_S$ and to reduce the charging of $C_{VCC}$ and the substrate current.

Other features and advantages of the present invention will become apparent from the following description of the invention which refers to the accompanying drawings.

BRIEF DESCRIPTION OF THE DRAWINGS

FIG. 1 is a schematic of a prior art circuit showing a driver IC connected to drive a pair of high voltage devices;

FIG. 2 is a circuit schematic illustrating the operation of the circuit of FIG. 1;

FIG. 3 is a schematic showing the path of the commutating current when the top transistor device is turned off;

FIG. 5 is a circuit showing another feature of the present invention;

DETAILED DESCRIPTION OF THE INVENTION

Figure 4:
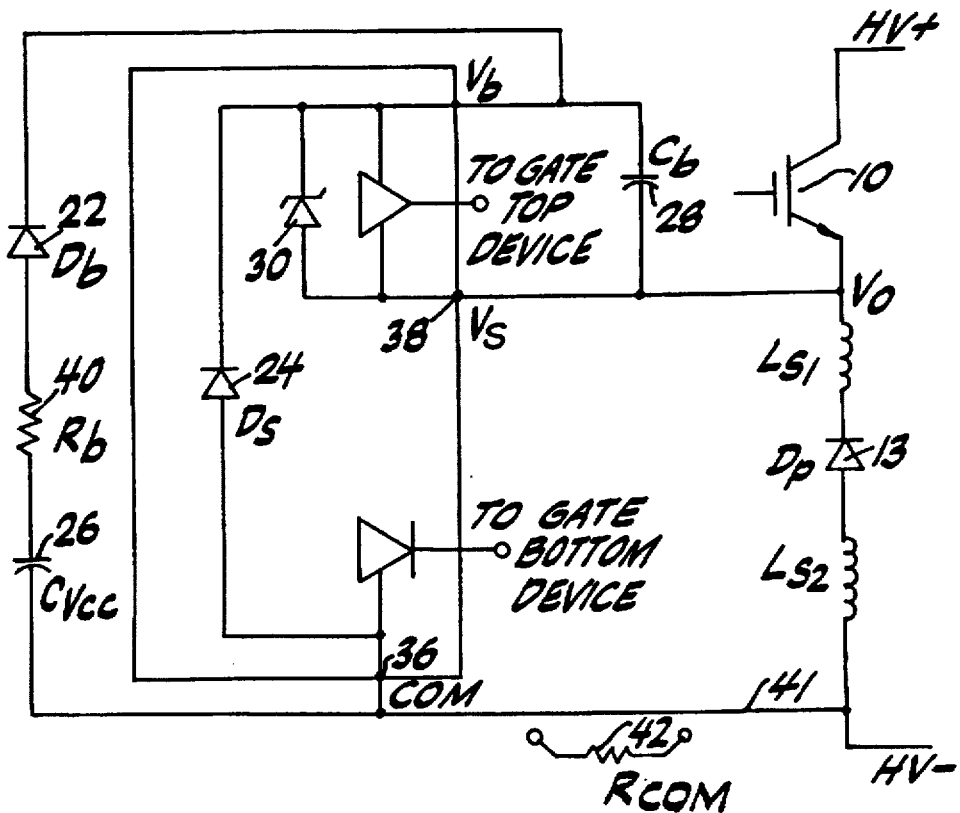
FIG. 4 illustrates an embodiment of the present invention.

To better describe the problem solved by the instant invention, reference is made to FIG. 4 which shows the relevant circuit components and the significant parasitic components. The circuit components include bootstrap diode $D_b$ (22) and a capacitor $C_{VCC}$ (26). Also shown is the parasitic substrate diode $D_S$ (24) of the IC and the input $C_{VCC}$ capacitor (26). There are two modes of failure when $V_O$ goes to $-V_e$.

In the first, the bootstrap diode $D_b$ (22) of FIG. 4 starts to conduct and charges capacitor $C_b$ (28). If the voltage on capacitor $C_b$ (28) exceeds the avalanche rating at the top driver (shown as a zener diode 30), then it destroys the IC 20. In the second mode, the bootstrap capacitor $C_b$ (28) can also charge up through the parasitic IC substrate diode $D_S$ (24). If significant current flows through diode $D_S$ (24), the IC can malfunction, be damaged or destroyed.

In the prior art, not enough attention has been paid to the component layout which causes the $L_{S1}$ and $L_{S2}$ inductors to increase. Moreover, the $C_b$ capacitor has been sized to hold up the driver voltage for the maximum pulse ON time and not for reducing the voltage buildup.

Figures 1, 2, 3, 5:
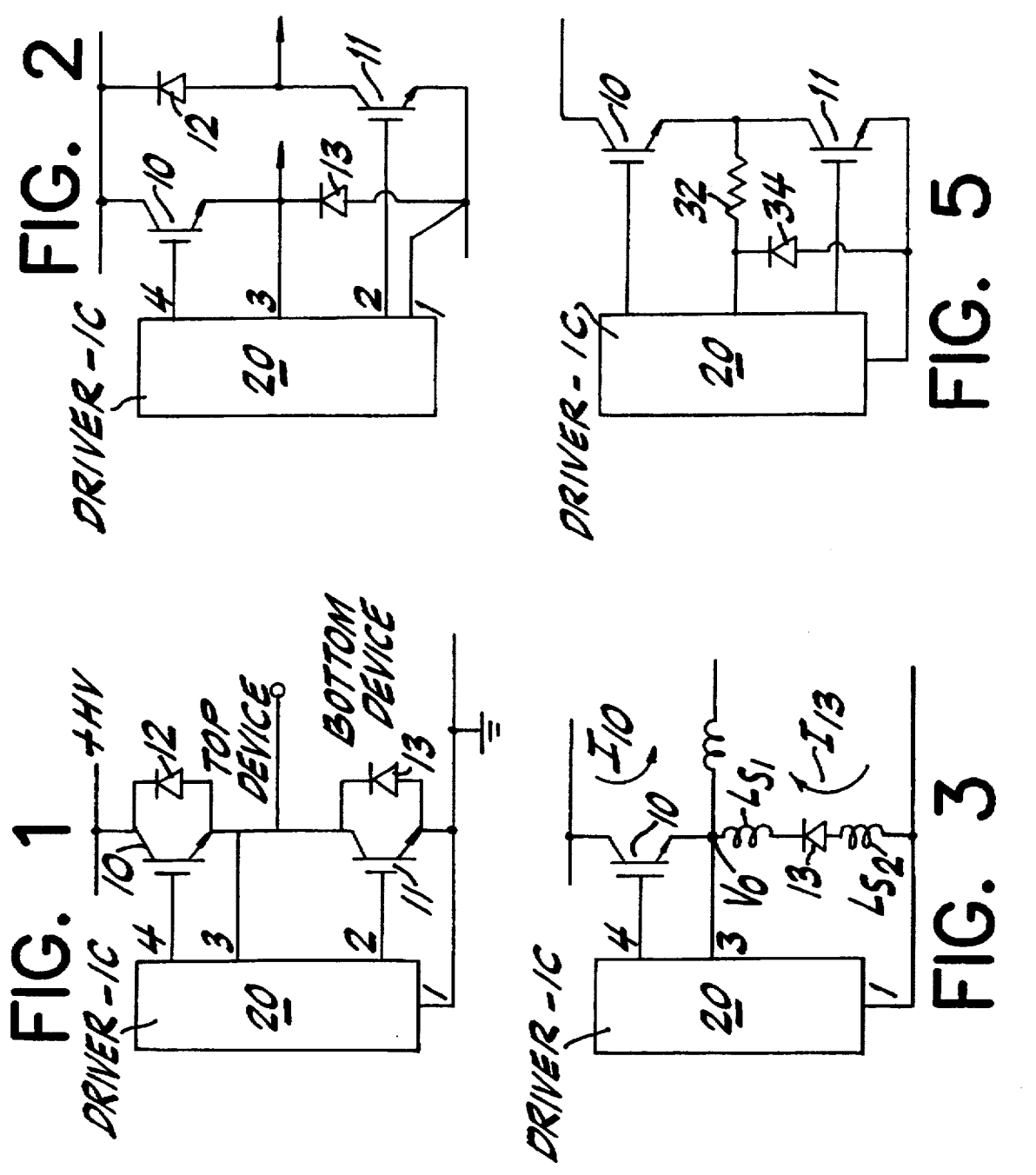

Prior art solutions to these problems have included adding a current limiting resistance to the bootstrap path and adding resistors, such as resistor 32 and high voltage diodes, such as diode 34 (FIG. 5) to limit the amount of $-V_e$. This, however, causes a gate voltage spikes and requires additional high voltage diodes.

Figure 6:
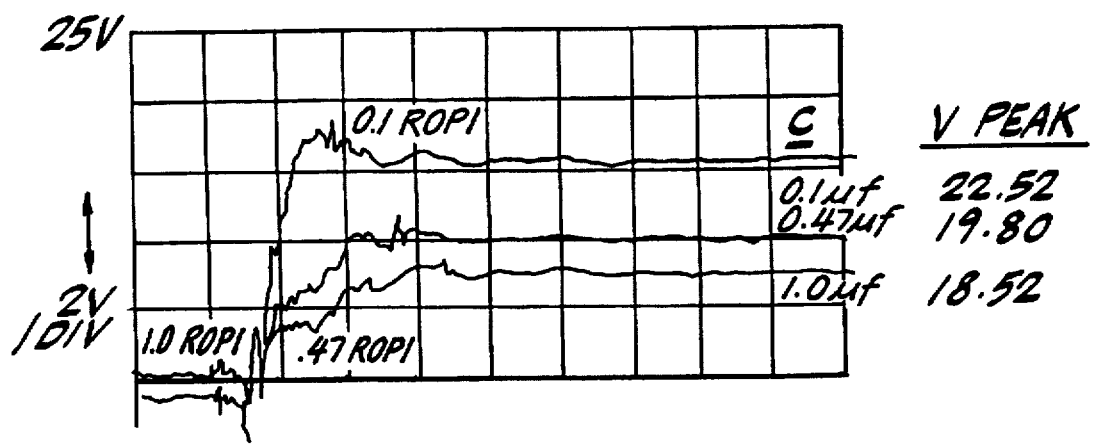
FIG. 6 is a plot of the capacitor voltage at different capacitance values, to show the reduced peak voltage on the capacitor at higher capacitance values.

In accordance with the present invention:

(a) The values of inductance $L_{S1}$ and $L_{S2}$ are reduced by keeping short conductor lengths and by positioning the $V_e$ connection 38 and "com" connection 36 in FIG. 4 to reduce the inductance path;

(b) The capacitor $C_b$ (28) value increased to cause the capacitance voltage to rise to a reduced value, as shown in FIG. 6. For a size 3 IGBT die (available from International Rectifier Corporation of El Segundo, Calif.), and laying out the parts on an IMS substrate, a capacitance of 0.47 µF is preferably used;

(c) The size of the $C_{VCC}$ capacitor 26 is increased to hold the $V_{CC}$ supply (FIG. 4) as "stiff" as possible since, if there are dips in the $V_{CC}$ voltage during bootstrap charging, the internal IC diode D. (24) can turn on earlier. Preferably, capacitor $C_{VCC}$ (26) should have a value of ten times the total of all $C_b$ capacitors in the system;

(d) The resistance $R_b$ (40) in the bootstrap path is reduced as much as possible. Resistor $R_b$ (40) limits the charging of capacitor $C_b$ (28) which causes increased current flow through the parasitic substrate diode, which can cause a malfunction. The recommended resistor value is 0 ohms;

(e) A resistor $R_{COM}$ (42) can be added in line 41 in FIG. 4 to increase the resistance in the path of substrate diode $D_S$ (24). Resistor $R_{COM}$ (42) also reduces the charging of capacitor $C_b$ (26) and the substrate current.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A driving circuit for high power devices, the circuit comprising:

a MOSgate driver and a power switching circuit, the power switching circuit including a first MOSgate transistor and a second MOSgate transistor, the MOSgate driver being connected to and serving to alternately turn on the first and second MOSgate transistors;

the power switching circuit having a voltage output node between the first MOSgate transistor and the second MOSgate transistor, and the second MOSgate transistor having associated therewith a recovery diode and inherent inductances $L_{S1}$ and $L_{S2}$;

the MOSgate driver comprising an integrated circuit and including an external capacitor $C_b$ connected between a circuit node $V_b$, and a circuit node $V_S$ of the MOSgate driver circuit, the MOSgate driver circuit further including a common node and a series circuit including a charging capacitor $C_{VCC}$, a resistor $R_b$ and a diode $D_b$ connected between the common node and the $V_b$ node; and the MOSgate driver circuit and the power switching circuit being connected as close as possible to one another to obtain short conductor lengths between the node $V_S$ and output node $V_O$ and between the common node and another common node of the power switching circuit, to thereby reduce the values of the inductances $L_{S1}$ and $L_{S2}$.

2. The circuit of claim 1, in which the capacitor $C_b$ has an increased value, substantially in excess of a capacitance needed to hold up a voltage of the first MOSgate transistor for a maximum pulse ON time, said increased value being determined by the inductances $L_{S1}$ and $L_{S2}$ and also by the size and type of said MOSgate transistors.

3. The circuit of claim 1, in which a capacitance of the capacitor $C_b$ has a value greater than about 0.47 µF, for IR size 3 "k" type IGBTs.

4. The circuit of claim 1, in which the capacitor $C_{VCC}$ has a value of at least about ten times the value of the capacitor $C_b$ in the circuit.

5. The circuit of claim 1, in which the value of the resistor $R_b$ is minimized.

6. The circuit of claim 5, in which the value of resistor $R_b$ is about 0 ohms.

7. The circuit of claim 1, including a resistor $R_{COM}$ of about 1 to 20 ohms between the common node of the MOSgate driver circuit and the common node of the power switching circuit.

* * * * *